United States Patent [19]

Kerbel

[11] 4,158,859

[45] Jun. 19, 1979

[54] AUTOMATIC CONTROL OF IRIS AND CLAMPING VOLTAGE IN VIDEO SIGNAL GENERATOR

[75] Inventor: Sheldon J. Kerbel, Merrick, N.Y.

[73] Assignee: Hazeltine Corporation, Greenlawn, N.Y.

[21] Appl. No.: 818,773

[22] Filed: Jul. 25, 1977

[51] Int. Cl.² .................... H04N 5/26; H04N 5/193; G06G 7/18

[52] U.S. Cl. .................................... 358/228; 358/217; 328/127; 358/75

[58] Field of Search .................. 358/75, 76, 78, 80, 358/107, 168, 174, 176, 178, 211, 221, 228; 328/168, 169, 187, 127; 307/237, 264, 229, 358; 324/76 A

[56] References Cited

U.S. PATENT DOCUMENTS

| | | | |
|---|---|---|---|
| 2,863,938 | 12/1958 | Evans et al. | 358/76 |
| 3,578,908 | 12/1968 | Tompkins | 358/168 |
| 3,590,811 | 7/1971 | Harris | 307/264 |
| 3,637,937 | 1/1972 | Deveson | 358/228 |
| 3,767,853 | 10/1973 | Bendell et al. | 358/228 |

Primary Examiner—John C. Martin

[57] ABSTRACT

The signal processing apparatus described is particularly useful in a graphic arts process simulating system. In a preferred embodiment, the apparatus makes use of a vidicon to generate a video signal in response to light signals. A controlled iris adjusts the intensity of light signals into the vidicon in accordance with the peak value of the video signal, so that the vidicon can operate with a range of light intensities corresponding to its optimum dynamic range. Prior to the iris adjustment, a measurement of the average video signal level is made and the resulting value stored. The stored signal value is used in conjunction with the average video signal level after iris adjustment to generate a pedestal correction voltage, which is used in a clamping circuit to provide an output video signal which is representative of the true characteristics of the image.

19 Claims, 14 Drawing Figures

AUTOMATIC CONTROL OF IRIS AND CLAMPING VOLTAGE IN VIDEO SIGNAL GENERATOR

BACKGROUND OF THE INVENTION

This invention relates to signal processing apparatus, and particularly to such apparatus as used in systems for simulating graphic arts process. The apparatus of the invention is particularly useful in connection with a signal transforming apparatus such as a video signal generator which transforms light signals into electrical signals.

Video signal generating apparatus is most commonly used in connection with television systems. In such systems, the light intensity of elementary portions of an image are sequentially sampled, usually in a raster pattern. The sequence of samples are joined to form a composite video signal having portions containing video or light intensity information and portions containing control information. The control information is usually between adjacent lines of light intensity information in a signal portion called the blanking interval. This portion of the signal corresponds to the time during which the electron beam of the television receiver picture tube is deflected back to start the next line. In this blanking interval, there is usually provided a clamping signal which determines the level of light intensity to be displayed on the picture tube in response to the video information signal. Values of light intensity during the video information portions of the signal are interpreted by the receiver by reference to the clamping signal level. The composite signal may include other information during the blanking interval, such as tonal pulses, for regulating the color in a color television transmission. These signal portions are not relevant to the invention.

The present invention relates to systems for simulating a graphic arts process. In a graphic arts process, an original color image, such as a color transparency, is used in conjunction with filters to provide a set of color separations, which are black and white transparencies representative of a particular elemental color content in a composite color picture. In the usual graphic arts process, the color separations are used in the etching of color printing plates. A color print is manufactured by sequentially printing three or four different color inks on the same piece of paper using printing plates made from the color separations.

The various steps in the color printing process include adjustments for the regulation of the color content of the eventual print. These adjustments are usually made by a skilled operator who must make adjustments according to his judgement to come out with an acceptable color print. In many cases, the process must be repeated after printing plates have been made and a "proof" made with the plates. The operator on viewing the proof again must use his own judgement to determine what adjustments to the process are required and must then go through the process of modifying the color separations or printing plates in order to obtain an acceptable color print.

In order to aid in the process of making the printing plates and to attempt to eliminate the need for multiple proof printing, there have been developed prior art systems for simulating the color printing process. Such prior systems are disclosed in U.S. Pat. Nos. 3,123,666 to Bailey; 3,128,333 to Loughlin; 3,131,253 to Farber et al.; and 3,800,071 to Reeber, all of which are assigned to the same assignee as the present invention. These prior patents disclose previewing systems which simulate either all, or a portion of, the color printing process and provide a display representative of a color print. The present invention is particularly useful in systems of this type.

In a color printing process previewing system, it is particularly important that there be obtained a very accurate video signal which is representative of the original image. Unlike conventional color TV which uses separate signals for brightness (i.e. black and white) and color information (with reduced bandwidth), previewing systems usually use at least three separate video signals, each representing the elemental color content of the original image. This results in a higher quality color image simulation and display. The three video signals may be derived by the use of a vidicon tube, according to the method taught by Farber et al., or may be derived by using a scanning light source and a photodetector tube. In either case, it is desirable to maximize the range of light values which can be detected and accurately converted into a video signal. In particular, vidicon tubes generally have a limited dynamic range and, therefore, it is important to adjust the amount of light incident on the vidicon tube to an amount which will make maximum use of the tube's dynamic range. In a television system, the light level incident on a vidicon can be arbitrarily adjusted by the operator to a level which gives the picture brightness which the operator considers desirable. In a graphic previewing system such an adjustment of the light level results in a loss of reference with respect to the original brightness of the image being previewed. In such systems, it is important to preserve the original light intensity reference level accurately so that the system displays an accurate simulation of the actual graphic arts process. The invention is equally applicable to other systems wherein it is desired to adjust the amplitude of a signal supplied to a signal transforming apparatus, and then adjust the transforming apparatus output signal to a level representative of the original amplitude of the supplied signal. Thus, the transforming apparatus can operate within its preferred dynamic range.

It is therefore an object of the present invention to provide a signal processing apparatus wherein the level of a supplied signal into a signal transforming apparatus can be adjusted in order to use the optimum dynamic range of the transforming apparatus.

It is a further object of the invention to provide such an apparatus wherein the output signal is representative of the amplitude of the supplied signal.

It is still a further object of the invention to provide such an apparatus wherein the level adjusting mechanism can be automatically returned to its original reference position.

SUMMARY OF THE INVENTION

In accordance with the invention, there is provided a signal processing apparatus for use in conjunction with a signal transforming apparatus having a preferred range of supplied signal amplitude. The apparatus includes means for modifying the amplitude of signals supplied to the signal transforming apparatus, including means responsive to output signals of the transforming apparatus. There are also provided means for generating an amplitude signal representative of the amplitude of the output signals and controlled storage means for storing the value of the amplitude signal. Controlling means are provided for controlling the operation of the amplitude modifying means and the storage means to cause the storage means to store the value of the amplitude signal with the amplitude modifying means in an initial condition and thereafter to cause the amplitude modifying means to adjust the amplitude of supplied signals until the transforming apparatus output signals are representative of supplied signals having an amplitude in the preferred amplitude range. Finally, there are provided means, responsive to the amplitude signal and the stored value of the amplitude signal, for changing a characteristic of the output signal to cause the output signals to be representative of the supplied signal.

The means for modifying the amplitude of signals supplied to the transforming apparatus may be responsive to the peak value of the transforming apparatus output signals while the amplitude signal generating means generates a signal representative of the average value of the output signal. The invention is particularly useful in a video signal generating apparatus wherein the signal transforming apparatus comprises a light detector. The output signal of the light detector is a video signal representative of image characteristics of successively scanned portions of an image. The means for modifying the amplitude of supplied signals comprises light adjusting means, preferably responsive to the peak value of the video signal.

The light adjusting means may include means, responsive to the amplitude signal and the stored signal, for returning the adjusting means to its initial condition. In a preferred embodiment, the light detecting means generates a video signal which is logarithmic and corresponds to the density of the image. A clamping signal may be generated using the value of the stored amplitude signal and the current value of the amplitude signal. This may be used in a clamping circuit to change the video signal by clamping the signal to the level of the clamping signal. Where a filter is provided between the image and the light detecting means there may be provided a means for generating a signal which is representative of the density of the filter. The filter density signal may then be used in developing the clamping signal. Where more than one filter may be used alternately, signals representative of the densities of the various filters may be generated and value used to generate the clamping signal according to which filter is being used. The light adjusting means may be either a motor driven iris or an adjustable intensity light source, The invention is particularly useful where the light detecting means comprises a vidicon.

According to another feature of the invention, there is provided a circuit for generating a signal representative of the average value of a video signal. The circuit includes a peak detector for generating a peak signal, representative of the peak value of the video signal. Means, responsive to the peak signal, are provided to generate a minimum signal, representative of a video signal level a selected amount lower than the peak signal. The video signal and the minimum signal are combined to form a modified video signal having a minimum value comprising the value of the minimum signal. An integrating circuit is provided for averaging the value of the modified video signal.

According to another feature of the invention, there is provided an apparatus for modifying the scale of a supplied logarithmic signal having a reference level. The apparatus includes means for generating a clamping signal having a selected voltage level, a clamping circuit for clamping the level of the supplied logarithmic signal to the level of the clamping signal, and means for linearly modifying the amplitude of the clamped logarithmic signal to generate an output logarithmic signal having a different logarithmic scale. The linear modifying means may include a linear amplifier, a voltage divider, or both.

For a better understanding of the present invention, together with other and further objects, reference is made to the following description, taken in accordance with the accompanying drawings, and its scope will be pointed out in the appended claims.

DESCRIPTION OF THE INVENTION

Figure 1:
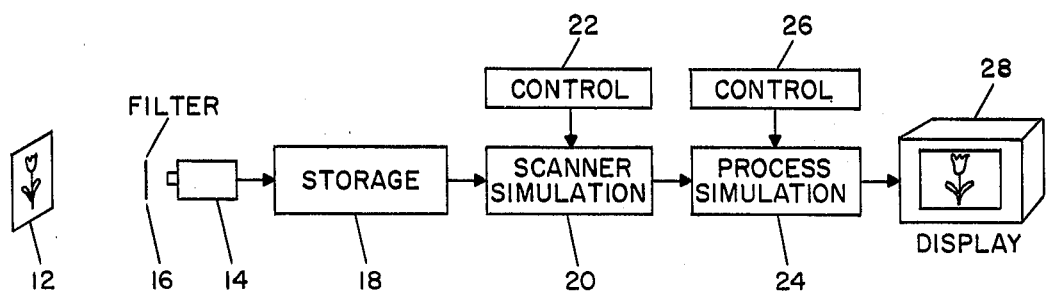
FIG. 1 is a block diagram of a graphic arts process previewing system.

Shown in FIG. 1 is a previewer system for simulating a color printing process. The system input is an image 12, which may be either a print or a transparency. Video signal generator 14 provides a video signal representative of image 12. A filter 16 may be placed between signal generator 14 and image 12 in order to derive a video signal representative of a single color component of image 12. Alternatively, image 12 may itself be a color separation transparency in which case no filter is required. In the previewing system of FIG. 1, if a color image 12 is provided, the various color components of image 12 are sequentially converted to video signals by signal generator 14 using different filters 16. The video signals representative of each elemental color are stored in a video signal storage apparatus 18, and may be simultaneously read-out from storage 18 in order to develop simultaneous signals representative of all the color components of image 12. There is provided a scanner simulating circuit 20 which simulates the operation of a conventional color scanner in converting a color image into multiple color separations. A control unit 22 is provided in connection with scanner simulator 20. Control unit 22 has multiple controls corresponding to the controls in a typical scanner, the operation of which is to be simulated. The output of scanner simulator 20 is a set of video separation signals which correspond to the image density of color separations which would result if the image 12 were placed in the actual color scanner and the scanner controls set in accordance with the corresponding controls of control unit 22.

The previewing system also includes color process simulating unit 24 which simulates the actual manufacture and use of printing plates and inks to produce a color print. An associated control unit 26 is provided for simulating variations in the color printing process. The output of the process simulation circuit 24 is provied to a color display unit 28 which displays an image corresponding to the resulting color print on a television type picture tube.

The previewing system provides a rapid electronic simulation of all the processes for making color prints. This system can therefore largely replace the actual process for the proofing operation and the operator can vary control units 22 and 26 to determine which variations in the printing process itself will likely result in the desired appearance of the color print. The use of video storage unit 18 enables the operator to remove image 12 from its position in front of video signal generator 14 and place it adjacent display unit 28 for comparison of the simulated color print with the original image 12.

Figure 2:
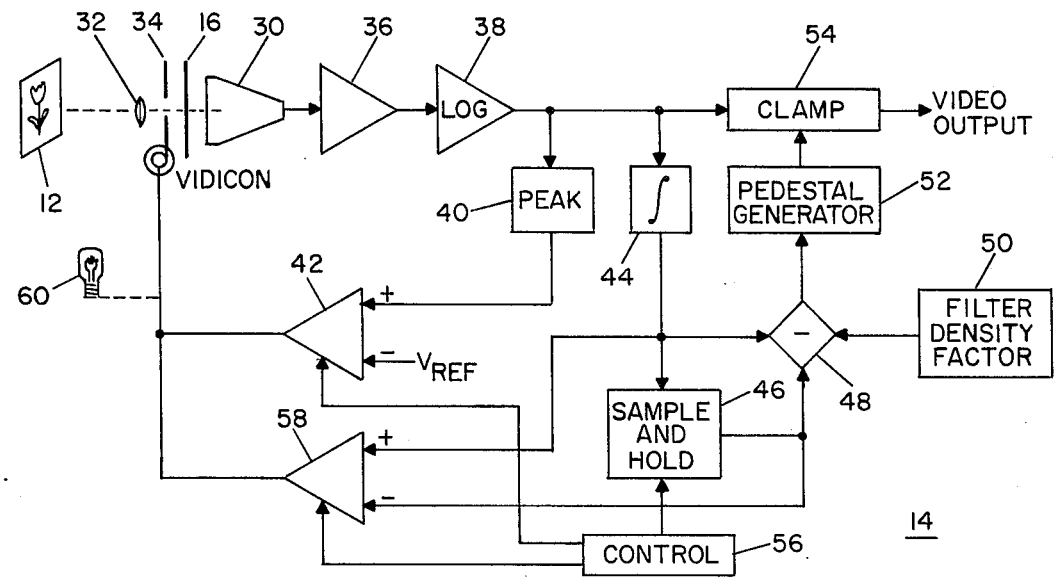
FIG. 2 is a block diagram of a video signal generating apparatus in accordance with the present invention.

The present invention relates to the video signal generator 14 which acts as a signal transforming apparatus to convert light signals from the original image into video signals. FIG. 2 is a detailed functional block diagram of signal generator 14. The original video signal is generated by vidicon 30 which is preferably a large dynamic range vidicon. Such vidicon tubes have a preferable operating range of light intensities. The preferred range of light intensities is the dynamic range of the tube which includes the range up to the light intensity which drives the vidicon to its peak output current. A recently developed vidicon tube has a sensitivity range of approximately 500 to 1 in light intensity, which corresponds to a range of image densities of 2.7. Image densities have a logarithmic relation to light intensity. Because of this logarithmic relationship, the densities of various objects, such as filters, have an additive relationship and the use of the logarithmic density scale facilitates computation of the filter's effect on a video signal.

Lens 32 is provided for focusing the image 12 onto the screen of vidicon 30. A power-operated iris 34 regulates the amplitude of light signals permitted to be incident onto the vidicon. A color filter 16, or various color filters, may be provided so that the video signal output of the vidicon is representative of the intensity of a single color component in image 12.

Figure 4A:
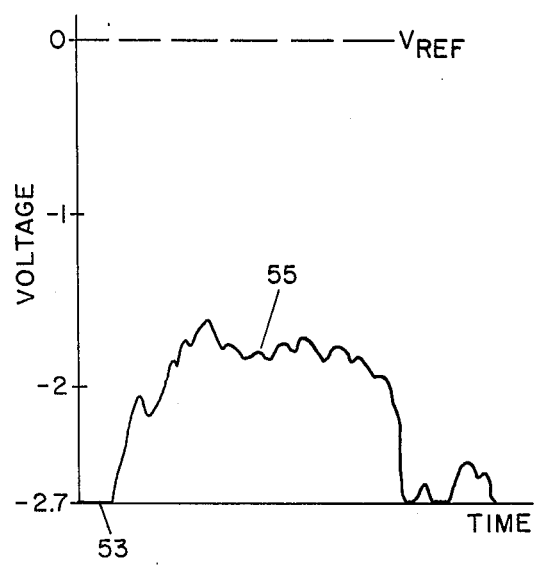
FIGS. 4A and 4B are graphs illustrating the composite video signals generated by the apparatus of FIG. 2.

A conventional amplifier 36 is provided at the output of vidicon 30, followed by logarithmic amplifier 38 which provides a logarithmic video signal proportional to the density of image 12. FIG. 4A illustrates the format of the logarithmic video signal. The composite video signal for a single raster line of the image is illustrated. There is provided in the video signal a clamping interval 53, which corresponds to the horizontal flyback interval in the scanning of the vidicon tube, and also a video signal portion 55, which is representative of the density of the image at various positions along a single raster line of the image. The actual video signal 55 is illustrated on a scale of density which ranges from 0 to 2.7 density. This is the preferred operating range of vidicon 30. As is evident from FIG. 4A, it is possible that various information in the darker portions of the image may be within the range of signal noise because of the fact that the maximum signal level of video signal 55 falls substantially below the maximum signal level of vidicon 30. This loss of signal level is the result of the image density of film 12 and the presence of filter 16.

Figure 4B:
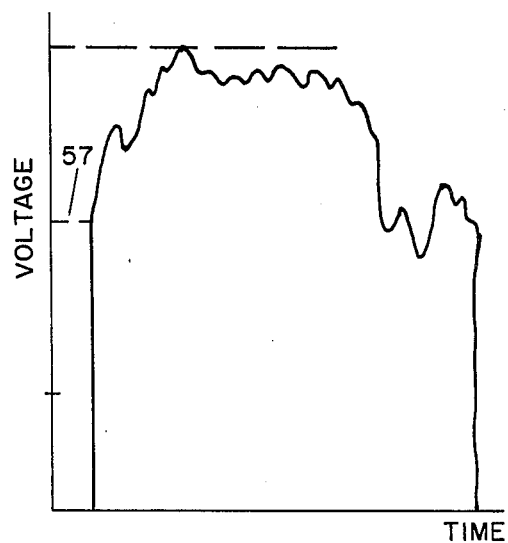

The video signal generating apparatus 14 includes a movable iris 34 which may be opened to modify the amplitude of light signals incident on vidicon 30 such that the incident light has a maximum amplitude level corresponding to the highest value in the preferred operating range of the vidicon. The adjustment of iris 34 is achieved using the peak detector 40 and differential amplifier 42. Peak detector 40 is gated to operate only during the video information portion 55 of the composite video signal at the output of logarithmic amplifier 38. Peak detector 40 detects the highest level of the logarithmic video signal during a representative period, for example one full frame of the raster, and stores that value. Differential amplifier 42 is additionally provided with a reference voltage which corresponds to the highest signal output level available from vidicon 30. The differential amplifier operates the iris 34 to open the iris until the detected peak signal level is equal to the reference level. This is illustrated in FIG. 4B. As a result of the iris adjustment, the light incident on vidicon 30 is adjusted to a level commensurate with the dynamic range of the vidicon, enabling the vidicon to operate over its entire available dynamic range and thereby produce a video signal with a high signal-to-noise ratio.

While it is desired, as set forth above, to increase the light intensity into the vidicon in order to operate at the optimum dynamic range of the vidicon, it is desired that the output signal range correspond to the intensity of light emitted by the image, so that a correct simulation of the actual printing process can be made. One technique for correcting the output video signal to a signal level corresponding to the actual light intensity of the image would be to perform a correction based on the change in position of iris 34. Another technique would be to measure the output of peak detector 40 after adjustment of iris 34 and correct the signal in accordance with the change in the peak level. Measurement of the change in iris 34 is necessarily difficult, because it is a mechanical adjustment, and does not yield a correction factor which can be accurately determined. The iris movement may also include changes on account of a variation in light intensity produced by the lamp illuminating image 12. A measurement of the change in the output of peak detector 40 can be used to generate a correction to the video signal, however, the peak detector output depends to a large extent on the bandwidth of the input video signal and is therefore not the most accurate and reliable quantity from which a correction signal can be generated.

A better measurement of the change in light intensity which has taken place by the opening of iris 34 can be made by taking an average value of the video signal before and after the iris change. This averaging is achieved by integrator circuit 44. The output of circuit 44 is stored in sample and hold circuit 46 prior to the opening of iris 34. After iris 34 has been opened so that the output of peak detector 40 is equal to the reference level $V_{ref}$, the output of integrator 44 has changed to correspond to the average level of the video signal with vidicon 30 operating at its peak level. The difference between the output of integrator circuit 44 after iris adjustment and the value stored in sample and hold circuit 46 is computed in subtractor circuit 48 and represents the change in amplitude of the video signal as a result of the adjustment of iris 34. This value is provided to a pedestal generator circuit 52 which generates a pulse having the amplitude of the subtracted signal and having a pulse width corresponding to the clamping interval 53 of the video signal. this pulse is provided to a clamping circuit 54 which inserts the pulse as the clamping level in the video signal as shown by dotted line 57 in FIG. 4B. As a result, the composite video signal has been processed through vidicon 30 and the video amplifiers 36 and 38 at the optimum signal level, but by reason of the clamping circuit 54 is again reduced to a signal level which accurately corresponds to the light intensity of the image 12.

Preferably, the initial position of iris 34 may be made to correspond to a maximum signal level in vidicon 30 in the presence of filter 16 with a pure white image. Alternatively, the initial opening of iris 34 may correspond to the peak output signal with only a light source and no filter. Since the filters used in the system are normally changed to produce multiple video signals, each representative of one of the elemental color components of image 12. When the initial opening of iris 34 corresponds to only a white light source, the adjustment made to iris 34 by differential amplifier 42 will compensate not only for the density of image 12, but also for the density of filter 16. In order that the video signal output be representative of the density of image 12, it is necessary to subtract from the pedestal correction signal, which is computed in subtractor 48, a signal whose value is equivalent to the density of filter 16. This compensating signal is provided by filter density factor generator 50 which provides a dc signal to be subtracted from the difference between the outputs of the sample and hold 46 and integrator 44. Thus, while the difference between the value in sample and hold circuit 46 and the output of integrator 44 after iris adjustment may be representative of the average density signal change because of image 12 and filter 16, the value supplied to pedestal generator 52 will be representative only of the average density signal change because of image 12. The video signal output from clamping circuit 52 will therefore be at a level which corresponds to image 12 without filter 16, but having a signal content representative of a color component of image 12 determined by filter 16.

After iris 34 has been adjusted in accordance with the peak signal output from logarithmic amplifier 38, and a pedestal correction signal has been generated and supplied to clamping circuit 54 in order to develop a video signal corresponding to a property of image 12, the output video signal may be stored. Filter 16 is normally changed to produce multiple video signals, each of which is representative of a different one of the elemental color components of image 12. Therefore, to obtain full information on image 12, it is necessary to insert a second filter 16 to derive another elemental color component video signal from image 12. Prior to starting the process again, iris 34 must be returned to its initial condition so that a proper correction pedestal can be derived using the new filter. This is achieved by summing amplifier 58, which is supplied with the signal output from integrator 44 representing the average signal level of the output of log amplifier 38, and is also provided with the stored average signal output from sample and hold circuit 46. Summing amplifier 58 operates iris 34 until the average signal from integrator circuit 44 is equal to the stored signal in sample and hold circuit 46. At this point, the iris is returned to its initial condition.

Control circuit 56 is provided to operate the various elements of the video signal generator according to a sequence. When an image is placed in front of vidicon 30, iris 34 is in its initial condition. Control circuit 56 provides a signal to sample and hold circuit 46 causing that circuit to record the average signal output from integrator circuit 44 while iris 34 is still in its initial condition. Following the recording of the output of integrator circuit 44 in sample and hold circuit 46, control circuit 56 provides a signal to activate differential amplifier 42. Amplifier 42 operates under the influence of the output of peak signal detector 40 and the reference voltage $V_{ref}$ to open iris 34 until the light incident on vidicon 30 corresponds to the maximum operating signal level for the vidicon. Once it reaches this condition, the output of integrator circuit 44 has changed and is now an average signal level which has increased from the original signal level by reason of the opening of iris 34. The difference in signal level between the outputs of integrator circuit 44 and sample and hold circuit 46 is computed in subtracting in circuit 48 and, in one case, is compensated for the density of filter 16 by subtracting the signal from filter density factor circuit 50. Pedestal generator 52 provides a clamping pulse of the appropriate level and duration to correct the level of the video signal output in clamp circuit 54 to correspond to the actual density of image 12. This video signal output can then be recorded or used.

If the video signal generator 14 of FIG. 2 is used in the graphic arts simulating system 10 of FIG. 1, the output video signal using a first filter 16 is recorded in storage circuit 18. At this point, it is necessary to change filter 16 to provide another filter which will cause the video signal to represent a different elemental color of the image 12. Prior to starting a measurement of a different color component of image 12, it is desired that iris 34 be returned to its initial condition. The return to initial condition of iris 34 is caused by controller 56 providing a control signal to summing amplifier 58, which acts under the influence of the average signal from integrator 44 and the stored signal from sample and hold circuit 46 to move the iris until the output of the average circuit 44 is equal to the value stored in the sample and hold circuit 46.

As described previously, if the system is calibrated with a first filter 16 in place, then it is necessary to provide a compensating signal input to summing amp 58 from unit 50, which is proportional to the difference in density between the first and second filters. For example, if the density of the second filter is 0.1 less than the first, a dc compensating signal from unit 50 will cause iris 34 to close an additional 0.1 density below its original initial setting. A similar compensation is made before each subsequent filter is introduced. At this point, iris 34 is in its initial condition and filter 16 may be changed in order to repeat the process and eventually provide second and third output video signals representative of different elemental colors in image 12 to storage circuit 18.

It should be recognized that the signal processing apparatus described is useful in other than video signal generators. In general, the apparatus is useful to modify the amplitude of a signal supplied to a signal transforming apparatus in accordance with the preferred operating range of the transforming apparatus. This type of control may be useful with acoustic transducers, mixers, or other signal transforming equipment. In accordance with the invention, the output signal of the transforming apparatus is changed to be representative of the original signal. The output signal change may be additive in the case of a logarithmic output signal, or multiplicative in the case of a linear signal.

Figure 3:
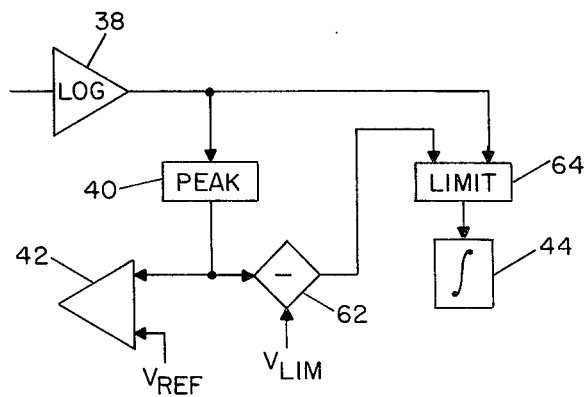
FIG. 3 is a block diagram showing an alternate configuration for a portion of the FIG. 2 apparatus.
Figure 5:
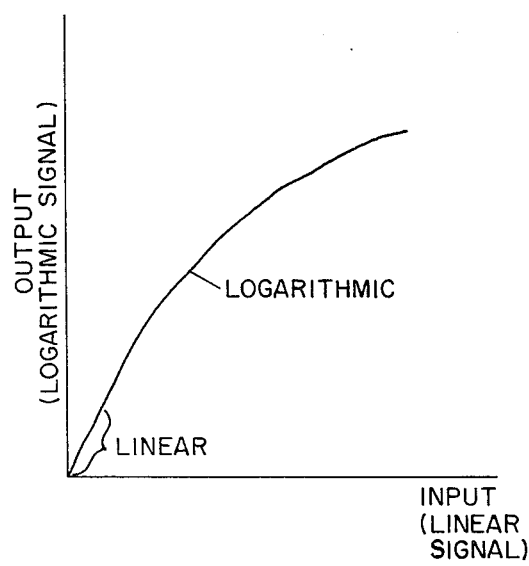
FIG. 5 is a graph which illustrates the output signal level as a function of input signal level for a logarithmic amplifier of the type used in the apparatus of FIG. 2.

FIG. 3 is a functional block diagram of a portion of video signal generator 14, which shows a variation in the circuit. In the video signal generator 14 a problem can arise in obtaining an accurate value for the output of integrator 44 prior to the opening of iris 34. Because the average density of image 12 and filter 16 may be considerable, the output of logarithmic amplifier 38 prior to the opening of iris 44 may attain very low signal levels. FIG. 5 illustrates the characteristic of logarithmic amplifier 38. For very low input signal levels, the output is linear. For normal values of input signal, the output is logarithmic, and it is generally desired that the amplifier operate within its logarithmic range.

Figure 6:
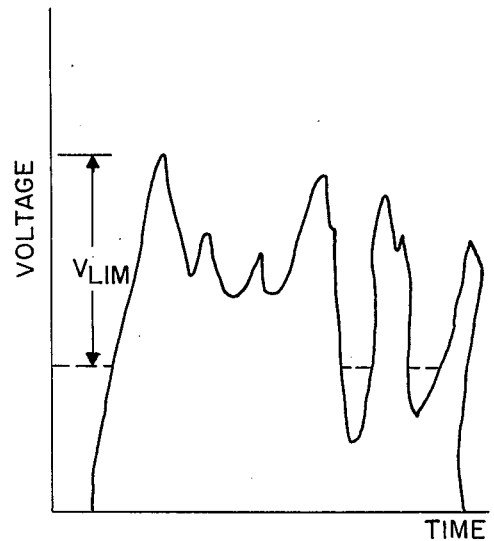
FIG. 6 illustrates a video signal as modified by the limiting circuit of FIG. 3.

Since no adjustment to iris 34 is made at the time the average signal output of integrator 44 is stored in sample and hold 46, it is possible that certain portions of the signal provided to integrator circuit 44 may be at a signal level which corresponds to the linear range of logarithmic amplifier 8. When iris 34 is opened to provide input light intensity corresponding to the maximum range of vidicon 30, the portions of the video signal which previously were in the linear range of logarithmic amplifier 38 will now be in the logarithmic range of that amplifier, causing some differences in the shape of the video signal as the system gain is increased. Since it is necessary to take the difference of the average value of the video signals before and after iris 34 is adjusted, the change in shape of the video signal can result in an error in the signal supplied to pedestal correction circuit 52. The modification illustrated in FIG. 3 is designed to eliminate this possibility by limiting the range of the video signal below its own peak value prior to introducing the video signal into integrating circuit 44. The lower level of the video signal is selected to be a certain amount, for example one density range, below the peak level of the video signal. The output of peak detector 40 is provided to a subtracting circuit 62 which subtracts from the peak signal a signal corresponding to the desired density range, for example a density of one, to achieve a signal which is a selected amount below the peak signal level. This signal is provided to limit circuit 64 which modifies the video signal by providing a minimum signal value corresponding to the output of subtractor 62. The signal into integrating circuit 44 is therefore free of signal values below the logarithmic range of logarithmic amplifier 38. This minimum value signal limiting is illustrated in the video signal of FIG. 6. Since a similar video signal modification is made to the video signal which occurs before and after iris adjustments, the difference between the average value of these signals computed in subtracting circuit 48 represents a true difference in the average values of these signals, having removed the possibility of errors caused by the linear region of logarithmic amplifier 38.

Figure 7:
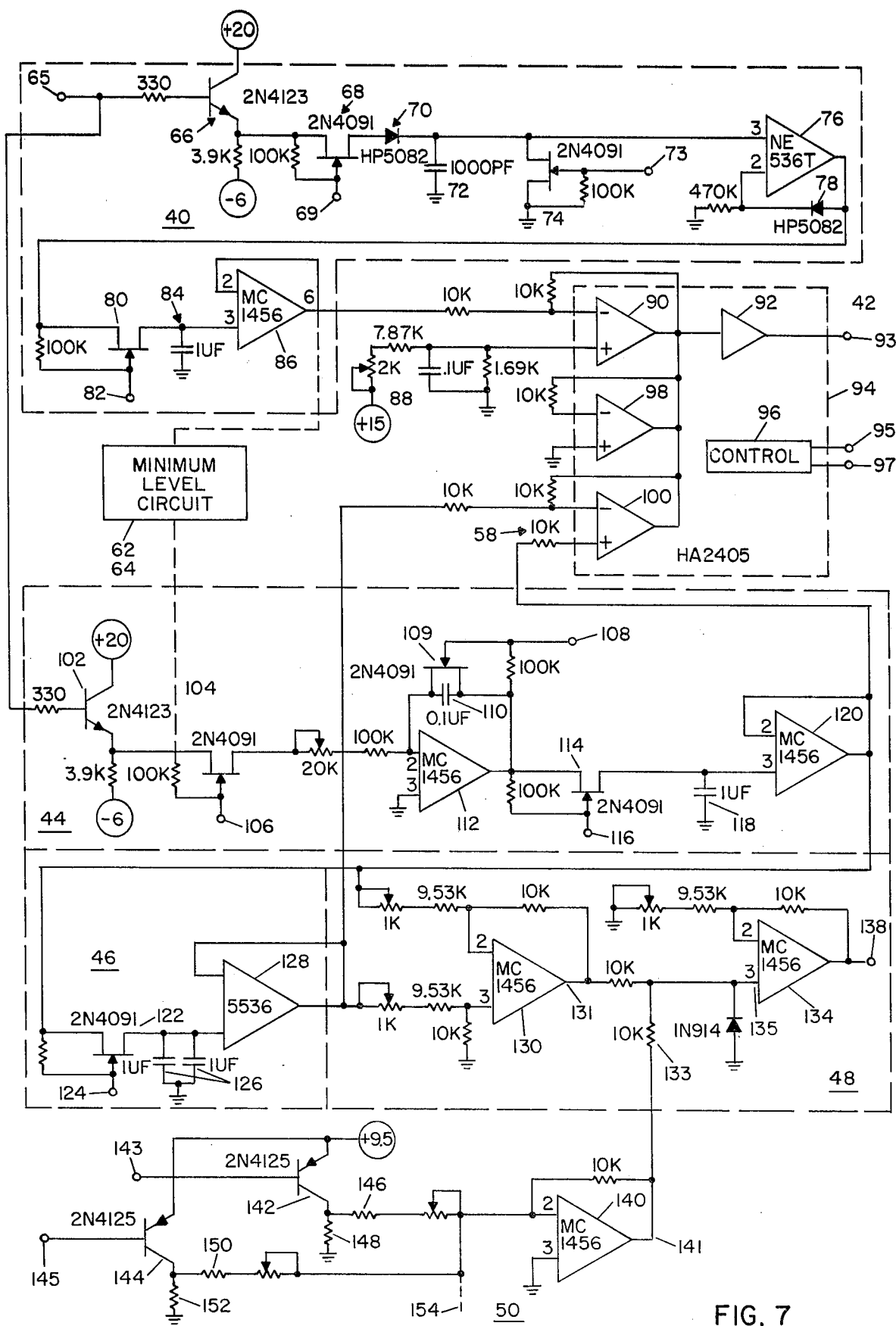
FIG. 7 is a schematic diagram illustrating the principle components of the peak detector, differential amplifiers, integrator, storage, subtractor, and film density signal generator in the FIG. 2 apparatus.

FIG. 7 is a schematic diagram illustrating the principle components used in the peak detector, differential amplifiers, integrating circuit, sample and hold, subtracting circuit, and filter density factor circuit of the video signal generator of FIG. 2. The circuit diagram does not illustrate power supplies or components necessary for the generation of timing and control signals. Also not shown are power supply connections to the various operational amplifiers used in the circuit, since these connections are well known to those familiar with such components and circuits. The timing and control signals used by the circuit are generated by ordinary logic or transistor elements in a manner well known to those familiar with the art. In the ensuing description, the timing and function of these control signals will be described and those familiar with circuits of this type will be able therefrom to design suitable circuitry for generating these control signals.

Shown at the top of FIG. 7 is the peak detector circuit 40. The input 65 to the peak detector 40 is supplied with the video signal output from logarithmic amplifier 38 in FIG. 2. This signal is supplied to buffer transistor 66 and thereafter to transistor switch 68. Switch 68 is supplied by terminal 69 with a control signal which opens switch 68 during clamping or blanking intervals in the composite video signal. Diode detector 70 is therefore supplied only with signals which correspond to the video portion 55 of the composite video signal output from logarithmic amplifier 38. The peak value of the video signal detected by diode 70 charges capacitor 72 to a voltage corresponding to the peak signal value. The voltage is provided to operational amplifier 76, which is configured to maintain the charge on capacitor 72 while approximately an entire field of image 12 is sequentially sampled by vidicon 30. Diode 78 compensates for the voltage drop across diode 70 so that the output of amplifier 76 is representative of the actual peak voltage. Following the entire field sample, a signal may be supplied to transistor switch 80 by terminal 82 which briefly closes the switch, and thereby enables the output of operational amplifier 76 to be supplied to capacitor 84, which in conjunction with operational amplifier 86 provides a sample and hold circuit, which samples the output of operational amplifier 76 at the end of a field, thereby storing a signal representative of the maximum value of the video signal during the field. Following the readout of operational amplifier 76 and opening of transistor switch 80, a signal is supplied to terminal 73 of transistor switch 74, causing switch 74 to close and short circuit cpacitor 72, discharging the capacitor and placing the peak detector in a condition to read the peak value of the signal during the next sample period. Operational amplifier 86 provides a continuous readout representing the peak value of the video signal during the last sampling interval of the peak detector. The output of operational amplifier 86 is provided to one terminal of differential amplifier input port 90 of differential amplifier 92. When port 90 of differential amplifier 92 is activated, it is the differential amplifier designated 42 in FIG. 2. Differential amplifier 92 is connected to the iris control motor by termianl 93. One terminal of differential amplifier port 90 of differential amplifier 92 is provided with a constant voltage from voltage generating circuit 88. The voltage supplied to differential amplifier port 90 by circuit 88 is the equivalent signal output of logarithmic amplifier 38 when vidicon 30 is supplied with a light equal to the maximum light intensity signal in the vidicon's preferred operating range.

Differential amplifier port 90 is contained within an integrated circuit package 94, which also contains other differential amplifier ports 98 and 100. The package specified includes four such differential amplifier ports, but only three are used in the circuit of the present invention. Differential amplifier port 98 has one of its terminals grounded and is activated to lock iris 34 in a fixed position during certain operations of the previewer system. Differential amplifier port 100 is supplied with signals from sample and hold 46 and integrating circuit 44 as will be further explained. Control element 96, which is included in the same integrated circuit package, is supplied by its terminals 95, 97 with logic signals to determine which of the differential amplifier ports 90, 98, and 100 will be activated during various phases in the operation of the previewer system. The logic signals provided to the logic terminals of control element 96 are supplied by control signal generator 56. When control signal generator 56 activates the differential amplifier port 90, output control signals are supplied to the iris motor to cause the iris 34 to operate until the peak detected value of the video signal, which is stored in the sample and hold circuit 84, 86 is equal to the value set by voltage generating circuit 88.

Video signals from logarithmic amplifier 38 are additionally supplied from terminal 65 to integrator 44, which is shown further down in the circuit diagram of FIG. 7. Integrator 44 has an input buffer transistor 102, which also forms part of limit circuit 64 as will be further explained hereinafter. The output of transistor 102 is supplied by transistor switch 104, to operational amplifier 112 and capacitor 110 which are configured to integrate the value of the supplied video signal. Switch 104 is provided with control signals, similar to those supplied to switch 68, by terminal 106 to cause only the video representative portions of the composite video signal to be supplied to the integrating circuits 110, 112. The integrating circuit is provided with solid state switch 109, having control terminal 108, to discharge the integrating circuit in order to prepare it to start to integrate the signal during a subsequent field of scan. Prior to discharge of capacitor 110 to erase the integrating circuit, the signal level stored in the integrating circuit is coupled to a sample and hold circuit having capacitor 118 and operational amplifier 120. This is done by switch 114, which is briefly supplied with a control signal by terminal 116 at a time when it is desired to read the output of the integrating circuit, for example at the end of a raster field.

The output of the operational amplifier 120 is a signal representative of the average value of the video portion of the video signals supplied to terminal 65. This average value is supplied to a sample and hold circuit 46 when a control signal is supplied to terminal 124 of switch 122. This usually occurs before any iris adjustment is made by activating differential amplifier port 90. Sample and hold circuit 46, which includes two capacitors 126 and operational amplifier 128, is configured to provide a long term storage of the average signal level from integrating circuit 44 when iris 34 is in its initial condition.

The average signal from integrator 44 and the stored signal from sample and hold 46 are provided to differential amplifier port 100. This port is activated when it is desired to return iris 34 to its initial condition. As previously noted, control element 96 is supplied with control signals by terminals 95, 97 to cause differential amplifier port 90 to be activated for the opening of iris 34, to cause differential amplifier port 98 to be activated to lock iris 34 is a fixed position, and to activate differential amplifier port 100 to return iris 34 to its initial condition.

At the bottom of FIG. 7, there is shown signal generator 50 which is configured to supply selectively one of a plurality of constant value voltage signals corresponding to the density of variously colored filters which may be used in the graphic art previewing system. Circuits for providing only two outputs are shown, but obviously, three, four or more such circuits may be provided. Each of the transistors 142 and 144 is controlled by a signal supplied to a corresponding control terminal 143, 145 to operate only when a corresponding filter is being used in the simulation. Resistors 146, 148, 150, and 152 associated with transistors 142, 144 are configured such that the voltage appearing at the output terminal 141 of output amplifier 140 corresponds to the density of a corresponding color filter when one of the transistors 142, 144 is provided with a negative going triggering signal at its respective terminal 143, 145. The output of the filter signal generating circuit 50 is supplied to subtracting circuit 48.

Subtracting circuit 48 receives the output average signal from integrating circuit 44 and also receives the stored signal from sample and hold circuit 46. Operational amplifier 130 is configured to form the difference of these two signals. A further subtraction is made by resistors 132, 133 to form an input signal at terminal 135 of buffer amplifier 134 which is the difference between the stored signal and the average signal, reduced by a signal equal to the density of the color filter being used. This signal is the amount by which the dc level of the video signal output of logarithmic amplifier 38 must be decreased to be representative of the true density of image 12.

Figure 8:
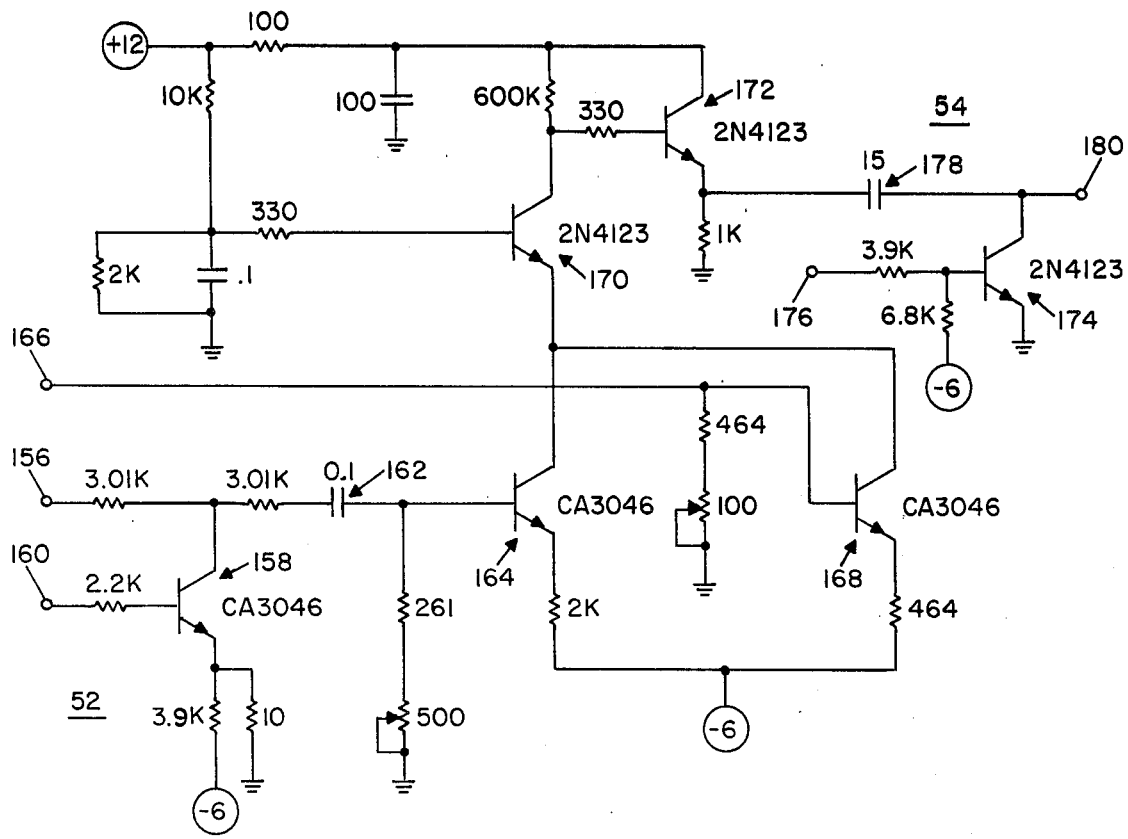
FIG. 8 is a schematic diagram illustrating the pedestal generating circuit and clamp circuit of the FIG. 2 apparatus.

The output from subtracting circuit 48 at terminal 138 is provided to terminal 156 of the circuit shown in FIG. 8. The circuit of FIG. 8 includes a pedestal generating circuit 52 and a clamping circuit 54 in which the correction voltage generated in subtracting circuit 48 is used to change the level of the composite video signal output from log amplifier 38. Transistor 158 in the pedestal generating circuit 52 is provided with a control signal at terminal 160 which causes transistor 158 to conduct at all times except during the clamping interval of the composite video signal. There is therefore developed an output to capacitor 162 which consists of a pulse having an amplitude corresponding to the correction signal level determined by subtracting circuit 48 and a duration equal to the clamping interval of the composite video signal. This pulse is ac coupled to current driving transistor 164. The composite video signal is supplied to terminal 166 and then to current driving transistor 168. The pedestal clamping pulse and composite video signal are combined in transistor 170 and provided to output transistor 172. Clamping circuit 54 is supplied with control signals to terminal 176 which cause transistor 174 to conduct during the clamping interval of the composite video signal. This causes capacitor 178 to be charged to a voltage such that the output signal at terminal 180 is grounded during the clamping interval and the remaining video signal varies with respect to the grounded clamping interval. The output video signal zero level will thereby be adjusted to a level 57 shown in FIG. 4B. This video signal will therefore correspond to the actual video signal shown in FIG. 4A, but will have passed through the various components of the system at a level corresponding to their optimum operating range.

Figure 9:
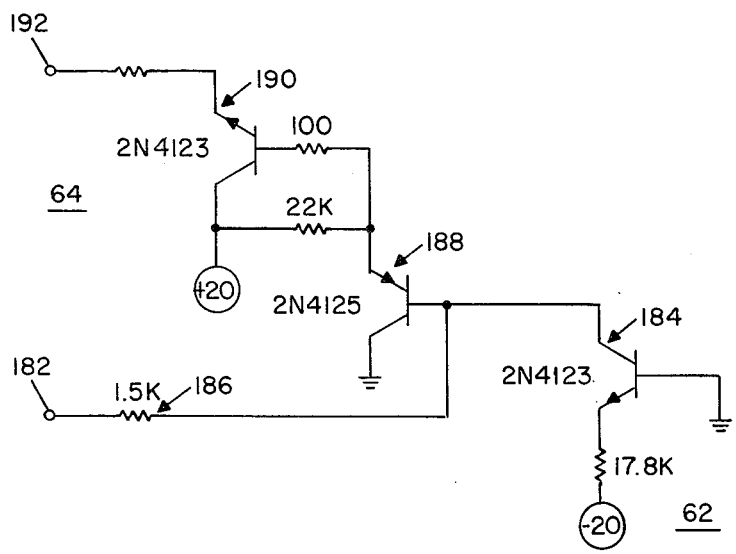
FIG. 9 is a schematic diagram illustrating the subtractor and limit circuit of the FIG. 3 apparatus.

Referring to FIG. 7, there is shown a block, indicated as minimum level circuit 62, 64 which corresponds to the modification of the functional block diagram shown in FIG. 3. The minimum level circuit is detailed in FIG. 9 and consists of subtracting circuit 62 and output stage 64. Input terminal 182 is connected to the output of operational amplifier 86 and therefore receives a voltage corresponding to the peak level of the video signal. Transistor 62 is configured to draw a selected amount of current through resistor 186 and therefore caused a voltage drop across the resistor corresponding to a selected voltage level. The signal supplied to output transistors 188 and 190 is therefore equal to the peak signal level of the video signal reduced by a selected dc voltage consisting of the voltage drop across resistor 186. The output at terminal 192 is supplied to integrating circuit 44 as shown in FIG. 7 by the dotted lead, and sets a minimum value for the video signal to be averaged by the integrating circuit. Output transistor 190 of circuit 64 and input transistor 102 of circuit 44 together act to provide the averaging circuit 110, 112 with a signal which is the greater of the video signal or the minimum level signal supplied by circuit 64.

Figure 10:
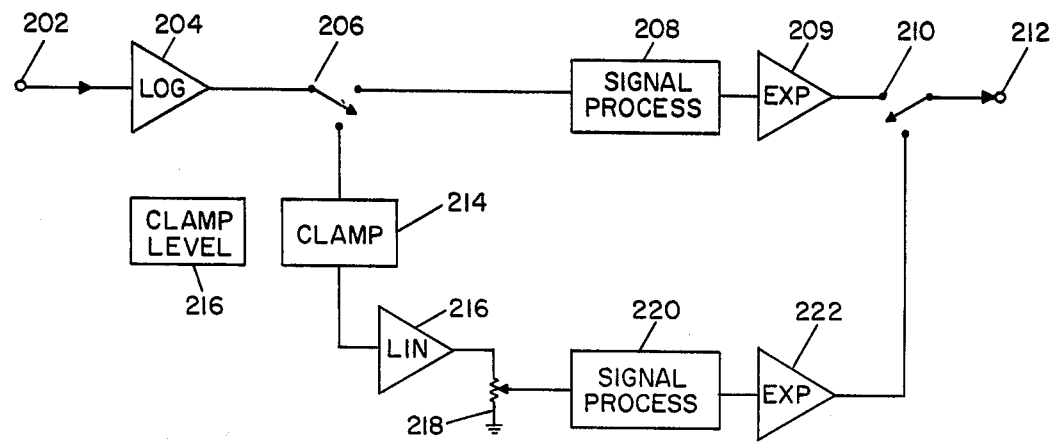
FIG. 10 is a block diagram of a circuit for changing the scale of a logarithmic signal.

FIG. 10 is a block diagram illustrating an application of the invention to a circuit for modifying the scale of a logarithmic signal. In certain applications, particularly a graphic arts previewing apparatus of the type shown in FIG. 1, it is desirable to convert video signals into logarithmic signals to facilitate signal processing. For example, it is often desirable to store video signals in logarithmic form because this signal form as a reduced range of minimum to maximum signal level. In some operations, a video signal may have a dynamic range substantially less than the full range of other signals. As explained above, the vidicon used in the signal generating apparatus of FIG. 2 is capable of providing a video signal with a logarithmic density range of 2.7. When the previewing apparatus is operated with color separations as the input image, the separations may have a density range of only 1.6. In order to make full use of the capabilities of signal processing or storage devices, it is desirable to change the logarithmic scale so that a selected range of logarithmic representative voltages is fully utilized to represent the video signal.

Figure 11A:
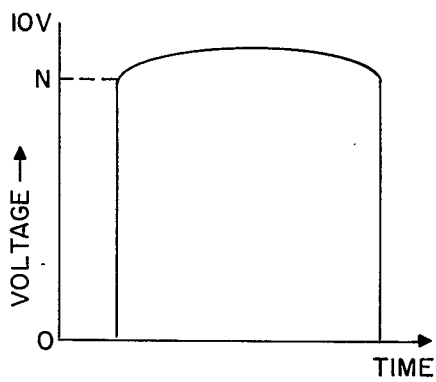
FIGS. 11A, 11B, and 11C are graphs illustrating the operation of the FIG. 10 circuit.

FIG. 11A illustrates a video signal of a simple form, which may represent the field illumination variation for a graphic arts previewer. It is noted that although a 10 volt range is available, only a small amount of this voltage range conveys useful information. The logarithmic signal of FIG. 11A may be expressed as follows:

$$L_1 = K_1 \log_{10} A + P_1 \quad (1)$$

where $K_1$ is the slope, $P_1$ a pedestal level and A is the linear signal function.

A logarithic signal with a different logarithmic slope may be expressed as follows:

$$L_2 = K_2 \log_{10} A + P_2 \quad (2)$$

and:

$$L_2 = M(L_1 + N) \quad (3)$$

$$\text{where } M = K_2/K_1 \quad (4)$$

and:

$$N = (K_1/K_2)P_2 - P_1 \quad (5)$$

It will be evident from Equation 3 that the slope (and range) of a logarithmic signal may be adjusted by adding (or subtracting) a pedestal (N) to the signal and then linearly modifying the amplitude. The circuit shown in FIG. 10 is capable of processing a logarithmic signal with or without an adjustment in the logarithmic slope. An amplitude representative linear signal is supplied at input terminal 202 and converted to a logarithmic signal in logarithmic amplifier 204. If the logarithmic signal has its normal dynamic range, switch 206 will be in a position to supply the signal to processing circuit 208, which may be an A to D converter, a signal modifier, or a storage unit. The original amplitude representative signal may be generated from the logarithmic signal in exponential amplifier 209 which may be connected to output terminal 212 by switch 210.

Figure 11B:
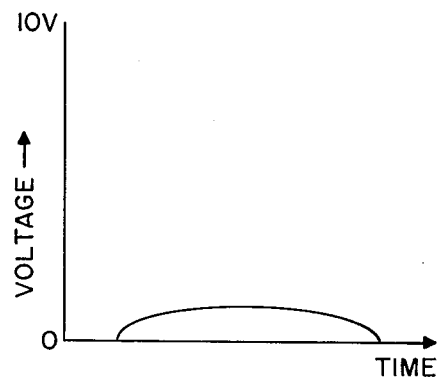
Figure 11C:
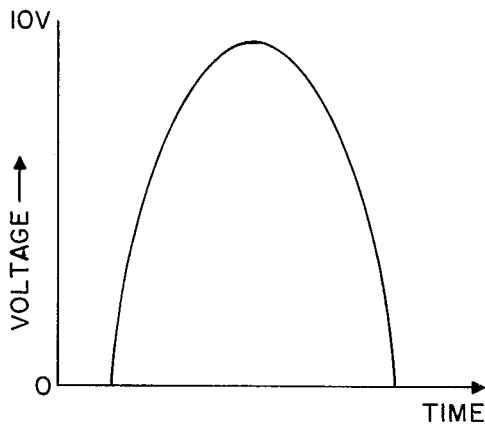

In the event the amplitude representative signal supplied to terminal 202 has less than the usual dynamic range, for example a field illumination signal shown in FIG. 11A, switch 206 may be changed so that the logarithmic signal from amplifier 204 is supplied to clamping circuit 214. Clamping circuit 214 is also supplied with a pulse signal from clamping level circuit 216. The pulse has a level corresponding to N in Equations (3) and (5) and a duration equal to the signal clamping interval. Clamping circuit 214 clamps the logarithmic signal to the level of the supplied clamping pulse changing the FIG. 11A signal into the clamped signal of FIG. 11B. A linear amplifier 216 may be used to bring the signal of FIG. 11B back to the full dynamic range, such as is shown in FIG. 11C. Thus, the logarithmic slope of the signal has been changed so that a relatively flat signal has its signal scale expanded so that it has a scale which makes full use of the available voltage range. This process is particularly helpful where the signal is to undergo a digital conversion. With the signal format of FIG. 11A, in the event digital samples of the signal level are measured, many bits of sampling and storage will be wasted, since many bits will always be full for any sample. When a signal is represented by the waveform 11C, in the event of a digital conversion the bit samples will be more economically used, and will be representative of finer variations in the original signal. The signal processing apparatus 220 and exponential amplifier 222 which receives the signal shown in FIG. 11C are configured to accept a signal with a modified logarithmic scale. Switch 210 may be used to supply the restored amplitude representative signal from exponential amplifier 222 to output terminal 212. Those familiar with the art will recognize that voltage divider 218 may be used alone, or in combination with linear amplifier 216 to adjust the value of the multiplication constant M in the process of changing the logarithmic slope and thereby negative as well as positive scale changes can be accomplished.

It will be evident to those skilled in the art that many modifications may be made to the circuit according to the particular system in which it is used and the operation mode of the system. For example, light detecting means other than a vidicon tube may be used, and the invention configured in substantially the same manner. A photodetecting tube may be the light detector and a cathode ray tube used as a light source for illuminating the image 12 with a raster light pattern. Another possible alternate to the use of motor driven iris 34 is the use of a variable intensity light source 60 illustrated in FIG. 2 and varied in intensity by differential amplifiers 42 and 58 to provide a variation in the intensity of light entering the vidicon 30 or other light detecting apparatus.

The functional block diagram of FIG. 2 illustrates clamping circuit 54 in a position of the video signal path following the point at which peak detector 40 and integrator 44 are connected. In actual implementation, it is possible to provide this clamping circuit at a point in the video circuitry prior to the peak detector 40 and integrator 44, for example at the output of logarithmic amplifier 38. In this case, it is necessary to gate the pedestal generator 52 so that no change is made to the video signal level by clamping circuit 54 while peak detector 40 and integrator 44 are sampling the signal level.

While the invention has been described with particular reference to a system for simulating a graphic arts process, it will be evident that the signal processing apparatus may be likewise applied to other systems wherein it is desired to operate a signal transducing apparatus at its preferred dynamic range, but produce an output signal representative of the input signal amplitude. Possible applications include light detecting systems, acoustic systems, analog-to-digital converters, or high-frequency receiving systems. The invention permits signal amplitude modification in a portion of the system to obtain optimum operating conditions.

While there have been described what are believed to be the preferred embodiments of the invention, those skilled in the art will recognize that other and further modifications may be made thereto without departing from the spirit of the invention, and is intended to claim all such modifications as fall within the true scope of the invention.

I claim:

1. Signal processing apparatus, for use in conjunction with a signal transforming apparatus which transforms a supplied input signal, the amplitude of which contains desired information when related to a given reference level, into a corresponding amplitude varying output signal in accordance with a predetermined signal transform characteristic, said transforming apparatus having a preferred range of input signal amplitudes, comprising:

means, responsive to the output signal of said transforming apparatus and to supplied control signals, for modifying the amplitude of the signal supplied to the input of said signal transforming apparatus;

means, responsive to the output signal of said transforming apparatus, for generating an amplitude signal which is a selected function of the amplitude of said output signal;

controlled storage means for storing the value of said amplitude signal;

means for controlling the operation of said amplitude modifying means and said storage means to cause said storage means to store the value of said amplitude signal with said amplitude modifying means in an initial condition and thereafter to cause said amplitude modifying means to adjust the amplitude of the signal supplied to the input of said transforming apparatus to be within said preferred range, thereby adversely affecting the reference level in said input signal and, therefore, the corresponding reference level in said output signal so that the amplitude of said output signal may not accurately represent said desired information;

and means, responsive to said amplitude signal and the stored value of said amplitude signal, for changing a characteristic of said output signals to restore the reference level therein so that the amplitude of said changed output signal, when related to said restored reference level, accurately represents the desired information in said input signal.

2. Apparatus as specified in claim 1 wherein said means for modifying the amplitude of signals supplied to said signal transforming means comprises means, responsive to the peak value of the output of said transforming apparatus, for generating a control signal and means, responsive to said control signal for modifying the amplitude of said supplied signals.

3. Apparatus as specified in claim 1 wherein said amplitude signal generating means comprises means for gnerating an amplitude signal representative of the average value of said output signals.

4. Apparatus for providing a signal representative of an image characteristic of successively scanned portions of an image, comprising:

light detecting means, responsive to light from said image and having a preferred peak value of incident light intensity, for providing a video signal the amplitude of which, when related to a given reference level, is representative of the light from successively scanned portions of said image;

means, responsive to the peak value of said video signal and to supplied control signals, for adjusting the intensity of light incident on said light detecting means;

means, responsive to said video signal, for generating an amplitude signal which is a selected function of the amplitude of said video signal;

controlled storage means for storing the value of said amplitude signal;

means for controlling the operation of said light adjusting means and said storage means to cause said storage means to store the value of said amplitude signal with said light adjusting means in an initial condition and thereafter to cause said light adjusting means to adjust said incident light intensity until its peak value is approximately equal to said preferred peak value thereby adversely affecting the reference level in said incident light and, therefore, the corresponding reference level in said video signal so that the amplitude of said video signal may not accurately represent the light from said image;

and means, responsive to said amplitude signal and the stored value of said amplitude signal, for changing a characteristic of said video signal to restore the reference level therein so that the amplitude of said changed video signal, when related to said restored reference level, accurately represents the light from said image.

5. Apparatus as specified in claim 4 wherein said means for generating said amplitude signal comprises means for generating an amplitude signal representative of the average value of said video signal.

6. Apparatus as specified in claim 4 wherein said light adjusting means includes means responsive to said amplitude signal and said stored amplitude signal for returning said adjusting means to said initial condition.

7. Apparatus as specified in claim 4 wherein said light detecting means comprises means for providing a video signal representative of the density of said image.

8. Apparatus as specified in claim 7 wherein said means for changing a characteristic of said video signal comprises:

means, responsive to said amplitude signal and said stored amplitude signal, for generating a clamping signal;

and a clamping circuit for clamping said video signal to the level of said clamping signal.

9. Apparatus as specified in claim 8 wherein there is provided a filter between said image and said light detecting means, wherein there is provided means for generating a signal representative of filter density, and wherein said means for generating said clamping signal is additionally responsive to said filter density signal.

10. Apparatus as specified in claim 9 wherein there are provided a plurality of said filters, and wherein said means for generating a signal representative of filter density comprises means for alternately generating one of a plurality of signals, each representative of the density of one of said filters.

11. Apparatus as specified in claim 4 wherein said light adjusting means comprises an adjustable iris.

12. Apparatus as specified in claim 4 wherein said light adjusting means comprises an intensity adjustable light source.

13. Apparatus as specified in claim 4 wherein said light detecting means comprises a vidicon.

14. Apparatus as specified in claim 4 wherein said means for generating an amplitude signal includes means responsive to the peak value of said video signal for generating a modified video signal having a minimum value of selected amount less than said peak value, and means for averaging said modified video signal.

15. Apparatus for providing a signal representative of the density of successively scanned portions of an image, comprising:
   a vidicon responsive to light from said image and having a preferred peak value of incident light intensity, for providing an output signal representative of the light intensity from successively scanned portions of said image;
   a logarithmic amplifier, responsive to said vidicon output signal, for providing a video signal representative of the density of successively scanned portions of said image;
   an adjustable iris, responsive to control signals, for adjusting the intensity of light supplied to said vidicon;
   a peak detector, responsive to said video signal, for providing a peak signal representative of the maximum value of said video signal;
   a first controllable differential amplifier, responsive to said peak signal and a reference voltage, for generating a first control signal for said iris;
   integrating means, responsive to said video signal, for generating an average signal representative of the average value of said video signal;
   controlled storage means for storing the value of said average signal;
   a second controllable differential amplifier, responsive to said average signal and said stored signal, for generating a second control signal for said iris;
   controlling means for controlling the operation of said storage means and said first and second controllable differential amplifiers to cause said storage means to store the value of said average signal with said light adjusting means in an initial condition, thereafter, to cause said first controllable differential amplifier to supply said first control signal to said iris, thereby to open said iris until said peak signal is equal to said reference voltage, and, at an appropriate time thereafter, to cause said second controllable differential amplifier to supply said second control signal to said iris, thereby to close and iris until said average signal is equal to said stored averaged signal, whereby said iris is in its initial condition;
   subtracting means, responsive to said average signal and said stored average signal, for deriving a clamping signal;
   and a clamping circuit for clamping said video signal to the value of said clamping signal, thereby to cause said video signal to be representative of the density of successively scanned portions of said image.

16. Apparatus as specified in claim 15 wherein there is provided a filter between said vidicon and said image, wherein there is provided means for generating a signal representative of the density of said filter, and wherein said subtracting means is also responsive to said filter density signal.

17. Apparatus as specified in claim 15 wherein said integrating means includes means, responsive to said peak signal, for generating a modified video signal having a minimum value a selected amount below said peak signal, and means for averaging said modified video signal.

18. A circuit for generating a signal representative of the amplitude value of a supplied signal, comprising:
   a peak detector for generating a peak signal representative of the peak value of said supplied signal;
   means, responsive to said peak signal, for generating a minimum level signal representative of a supplied signal level a selected amount lower than said peak value;
   means, responsive to said supplied signal and said minimum level signal for generating a modified signal having a minimum value comprising the value represented by said minimum level signal;
   and an integrating circuit for generating an average signal representative of the average value of said modified signal.

19. A circuit for generating a difference signal representative of a change in amplitude of a supplied signal, comprising:
   a peak detector for generating a peak signal representative of the peak value of said supplied signal;
   means, responsive to said peak signal, for generating a minimum level signal representative of a supplied signal level a selected amount lower than said peak value;
   means, responsive to said supplied signal and said minimum level signal, for generating a modified signal having a minimum value comprising the value represented by said minimum level signal;
   an integrating circuit for generating an average signal representative of the average value of said modified signal;
   controlled storage means for storing said average signal prior to a change in the amplitude of said supplied signal;
   and means, responsive to said average signal and said stored average signal for generating said difference signal.

* * * * *

UNITED STATES PATENT AND TRADEMARK OFFICE
CERTIFICATE OF CORRECTION

PATENT NO. : 4,158,859
DATED : June 19, 1979
INVENTOR(S) : Sheldon J. Kerbel

It is certified that error appears in the above—identified patent and that said Letters Patent are hereby corrected as shown below:

In the specification:

Column 3, line 40, after "detecting means" insert the following: "it can be automatically compensated for in the initial calibration of the system. Alternatively,"

Column 7, line 21, after "and no filter." delete rest of line

Column 7, lines 22 and 23, delete.

Column 7, line 24, delete "ponents of image 12."

Column 7, line 24, before "When the initial opening of iris 34" insert "If the initial position of iris 34 corresponds to a maximum signal level in vidicon 30 in the presence of filter 16 with only a light source (i.e., an all white image), then when image 12 is introduced the output video signal from log amp 38 will be proportional to only the density of image 12. Thus, the presence of filter 16 is automatically compensated for."

Column 7, line 24, before "When" insert the word "Alternatively," and start a new paragraph; change "When" to "when".

UNITED STATES PATENT AND TRADEMARK OFFICE
CERTIFICATE OF CORRECTION

PATENT NO. : 4,158,859
DATED : June 19, 1979
INVENTOR(S) : Sheldon J. Kerbel

It is certified that error appears in the above-identified patent and that said Letters Patent are hereby corrected as shown below:

Column 8, line 25, after "circuit 50." insert the following: "As noted previously, where the system is initially calibrated with filter 16 in place, compensation for the density of filter 16 is automatic and a signal from unit 50 need not be supplied to subtracting circuit 48."

Signed and Sealed this

Twenty-eighth Day of October 1980

[SEAL]

Attest:

SIDNEY A. DIAMOND

Attesting Officer

Commissioner of Patents and Trademarks